(12) United States Patent
Lee et al.

(10) Patent No.: US 10,304,918 B2
(45) Date of Patent: May 28, 2019

(54) ORGANIC LIGHT EMITTING DISPLAY DEVICE

(71) Applicant: Samsung Display Co., Ltd., Yongin-si, Gyeonggi-do (KR)

(72) Inventors: Dong-Hyun Lee, Suwon-si (KR); Jeongho Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/703,786

(22) Filed: Sep. 13, 2017

(65) Prior Publication Data

US 2018/0247988 A1  Aug. 30, 2018

(30) Foreign Application Priority Data

Feb. 24, 2017  (KR) .................. 10-2017-0024953

(51) Int. Cl.
| H01L 27/32 | (2006.01) |
| H01L 51/00 | (2006.01) |
| H01L 51/56 | (2006.01) |
| G09G 3/3225 | (2016.01) |
| H01L 51/52 | (2006.01) |
| G09G 3/3233 | (2016.01) |

(52) U.S. Cl.
CPC ....... *H01L 27/3248* (2013.01); *G09G 3/3225* (2013.01); *G09G 3/3233* (2013.01); *H01L 27/3258* (2013.01); *H01L 27/3276* (2013.01); *H01L 51/5206* (2013.01); *H01L 51/56* (2013.01); *G09G 2300/0426* (2013.01); *G09G 2300/0452* (2013.01); *G09G 2300/0819* (2013.01); *G09G 2300/0842* (2013.01); *G09G 2300/0861* (2013.01); *G09G 2300/0866* (2013.01); *H01L 27/3216* (2013.01)

(58) Field of Classification Search
CPC . H01L 27/3248; H01L 27/3216; H01L 27/32; H01L 27/327; H01L 27/3276; H01L 51/00; H01L 51/56; H01L 51/5206; G09G 3/32; G09G 3/3225
See application file for complete search history.

(56) References Cited

U.S. PATENT DOCUMENTS

| 2005/0040753 A1* | 2/2005 | Osame | G06F 1/1616 313/500 |
| 2012/0001182 A1* | 1/2012 | Choi | H01L 29/4908 257/59 |
| 2018/0033849 A1* | 2/2018 | Noh | H01L 27/3272 |

FOREIGN PATENT DOCUMENTS

KR  10-2016-0079477 A  7/2016

* cited by examiner

*Primary Examiner* — Thai Pham
(74) *Attorney, Agent, or Firm* — Lewis Roca Rothgerber Christie LLP (57) ABSTRACT

An organic light emitting display device includes: a substrate including an emission region and a non-emission region; a pixel circuit on the substrate, a portion of the pixel circuit overlapping with the emission region; a planarizing conductive member on the pixel circuit; and a pixel electrode on the planarizing conductive member, the pixel electrode having a planarized surface at the emission region.

20 Claims, 9 Drawing Sheets

ORGANIC LIGHT EMITTING DISPLAY DEVICE

CROSS-REFERENCE TO RELATED APPLICATION

This application claims priority to and the benefit of Korean Patent Application No. 10-2017-0024953, filed on Feb. 24, 2017, in the Korean Intellectual Property Office (KIPO), the entire disclosure of which is incorporated by reference herein.

BACKGROUND

1. Field

One or more aspects of example embodiments relate to display devices. More particularly, one or more aspects of example embodiments relate to organic light emitting display devices.

2. Description of the Related Art

An organic light emitting display device is a self-luminous display device, which includes organic light emitting diodes (OLEDs) for emitting light to display an image. Unlike a liquid crystal display (LCD) device, the organic light emitting display device may not require a separate light source, and thus, thickness and weight of the organic light emitting display device may be reduced. Moreover, the organic light emitting display device may exhibit high quality characteristics, such as low power consumption, high luminance, fast response speeds, and/or the like, and thus, has been receiving attention as a next generation display device for a portable electronic device.

The OLED may include a hole injection electrode, an organic light emitting layer, and an electron injection electrode. The OLED may emit light according to energy generated when excitons, which are combinations of holes injected from the hole injection electrode and electrons injected from the electron injection electrode, fall from an excitation state to a ground state.

The above information disclosed in this Background section is for enhancement of understanding of the background of the present disclosure, and therefore, it may contain information that does not constitute prior art.

SUMMARY

One or more aspects of example embodiments of the present disclosure are directed to an organic light emitting display device with a color shift phenomenon thereof being alleviated.

According to an example embodiment, an organic light emitting display device includes: a substrate including an emission region and a non-emission region; a pixel circuit on the substrate, a portion of the pixel circuit overlapping with the emission region; a planarizing conductive member on the pixel circuit; and a pixel electrode on the planarizing conductive member, the pixel electrode having a planarized surface at the emission region.

In an embodiment, the pixel electrode may be directly on the planarizing conductive member.

In an embodiment, the organic light emitting display device may further include a pixel connecting member on a same level as that of the planarizing conductive member, the pixel connecting member connecting the pixel electrode to the pixel circuit.

In an embodiment, the planarizing conductive member may be connected to the pixel connecting member.

In an embodiment, the organic light emitting display device of may further include a planarizing layer on the planarizing conductive member, and the pixel electrode may be on the planarizing conductive member with the planarizing layer interposed therebetween.

In an embodiment, the planarizing layer may have a contact hole through which the pixel electrode is in contact with the pixel connecting member, and the contact hole may be at the non-emission region.

In an embodiment, the organic light emitting display device may further include a driving voltage line on a same level as that of the planarizing conductive member, the driving voltage line being configured to transmit a driving voltage.

In an embodiment, the driving voltage line may be at the non-emission region.

In an embodiment, the planarizing conductive member may be connected to the driving voltage line.

In an embodiment, the organic light emitting display device may further include a via insulation layer covering the pixel circuit, and the planarizing conductive member may be on the via insulation layer.

In an embodiment, the via insulation layer may have a contact hole through which the pixel connecting member is in contact with the pixel circuit, and the contact hole may be at the non-emission region.

In an embodiment, a stepped surface may be at at least a portion of a top surface of the via insulation layer, and a top surface of the planarizing conductive member may be entirely flat.

In an embodiment, the organic light emitting display device may further include a scan line on the substrate, a portion of the scan line overlapping with the emission region, and the planarizing conductive member may be on the scan line.

In an embodiment, the organic light emitting display device may further include a data line on the substrate, a portion of the data line overlapping with the emission region, and the data line crossing the scan line, and the planarizing conductive member may be on the data line.

In an embodiment, an area of the planarizing conductive member may be greater than an area of the emission region.

In an embodiment, the organic light emitting display device may further include: an organic light emitting layer on the pixel electrode; and a common electrode on the organic light emitting layer, the common electrode facing the pixel electrode.

In an embodiment, the organic light emitting display device may further include: a via insulation layer between the pixel circuit and the planarizing conductive member, the via insulation layer covering the pixel circuit; and a planarizing layer on the via insulation layer, the planarizing layer covering at least a portion of the planarizing conductive member.

In an embodiment, the planarizing layer may have an opening exposing a center portion of the planarizing conductive member, and the planarized surface of the pixel electrode may be in the opening.

In an embodiment, the planarizing layer may cover an entirety of the planarizing conductive member, and the pixel electrode may be on the planarizing conductive member with the planarizing layer interposed therebetween.

In an embodiment, the organic light emitting display device may further include a pixel defining layer on the planarizing layer, the pixel defining layer covering a peripheral portion of the pixel electrode and defining the emission region.

The organic light emitting display device according to one or more embodiments of the present disclosure may include: a planarizing conductive member on a pixel circuit; and a pixel electrode on the planarizing conductive member and including a planarized surface in an emission region. Thus, color shift phenomenon of the display device may be alleviated.

BRIEF DESCRIPTION OF THE DRAWINGS

The above and other aspects and features of the present disclosure will become more apparent to those skilled in the art from the following detailed description of the example embodiments with reference to the accompanying drawings.

DETAILED DESCRIPTION

Hereinafter, example embodiments will be described in more detail with reference to the accompanying drawings. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

In the accompanying drawings, an active matrix (AM) type of organic light emitting display devices are illustrated to have a 7Tr-1Cap structure in which seven transistors and one capacitor are provided for one pixel, however, the present disclosure is not limited thereto. Thus, in the organic light emitting display device, each pixel may be provided with a plurality of transistors and at least one capacitor, and may be formed to have various suitable structures by further forming additional wires or omitting wires. In this case, a pixel refers to a minimum unit which displays an image, and the organic light emitting display device may display an image through a plurality of pixels.

Hereinafter, an organic light emitting display device according to one or more example embodiments will be described with reference to the drawings.

Figure 1:
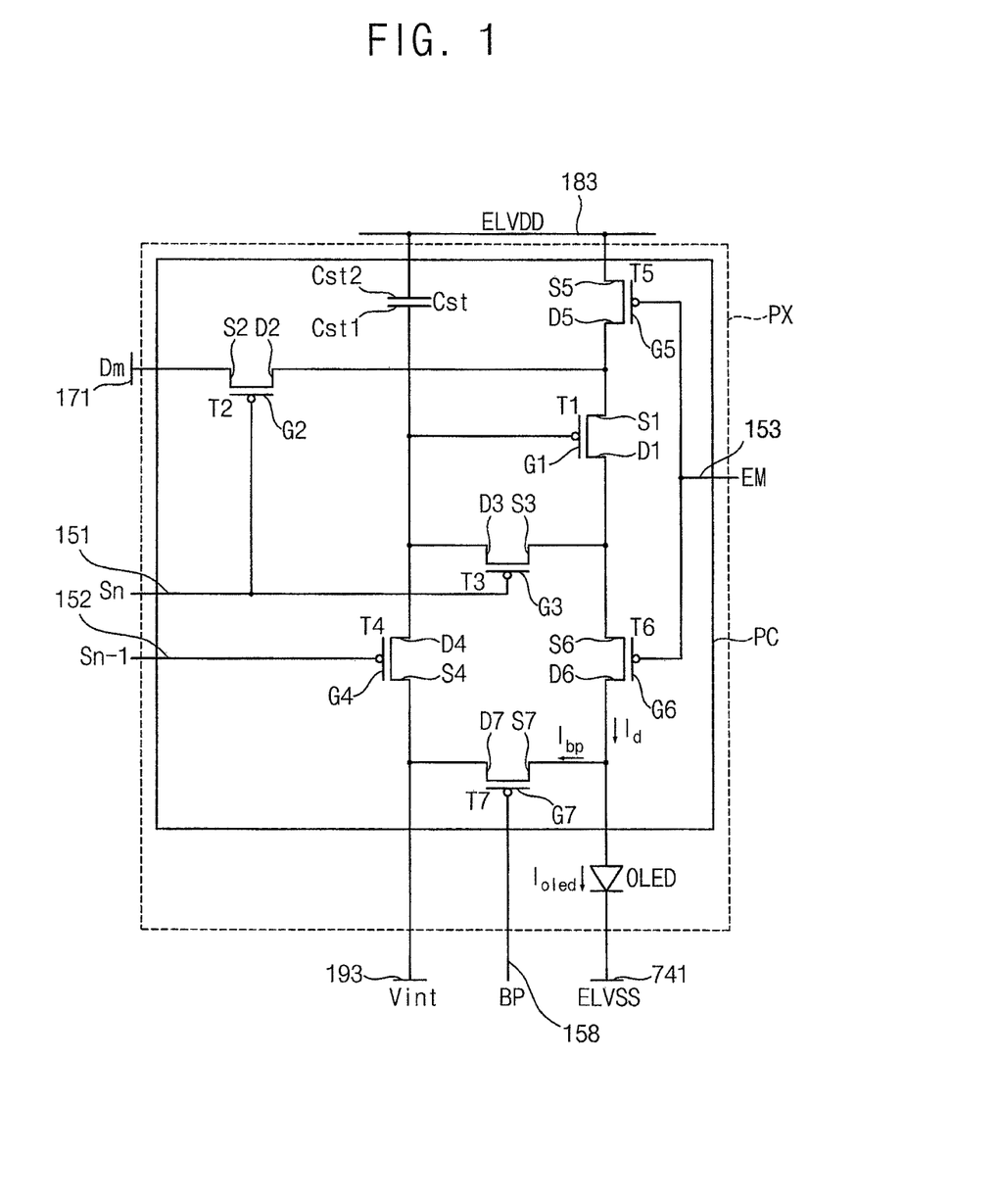
FIG. 1 is an equivalent circuit diagram illustrating a pixel of an organic light emitting display device, according to an example embodiment.

FIG. 1 is an equivalent circuit diagram illustrating a pixel of an organic light emitting display device according to an example embodiment.

Referring to FIG. 1, an organic light emitting display device, according to an example embodiment, may include a plurality of signal lines 151, 152, 153, 158, 171, 183, and 193, and a plurality of pixels PX arranged in a matrix form and connected to the plurality of signal lines 151, 152, 153, 158, 171, 183, and 193.

One pixel PX may include a pixel circuit PC and an organic light emitting diode OLED. The pixel circuit PC may include a plurality of transistors T1, T2, T3, T4, T5, T6, and T7, and a storage capacitor Cst, which are connected to the plurality of signal lines 151, 152, 153, 158, 171, 183, and 193.

The transistors T1, T2, T3, T4, T5, T6, and T7 may include a driving transistor T1, a switching transistor T2, a compensation transistor T3, an initialization transistor T4, an operation control transistor T5, a light emission control transistor T6, and a bypass transistor T7.

The signal lines 151, 152, 153, 158, 171, 183, and 193 may include a scan line 151 for transmitting a scan signal Sn, a previous scan line 152 for transmitting a previous scan signal Sn-1 to the initialization transistor T4, a light emission control line 153 for transmitting a light emission control signal EM to each of the operation control transistor T5 and the light emission control transistor T6, a bypass control line 158 for transmitting a bypass signal BP to the bypass transistor T7, a data line 171 crossing the scan line 151 and for transmitting a data signal Dm, a driving voltage line 183 for transmitting a driving voltage ELVDD, and an initialization voltage line 193 for transmitting an initialization voltage Vint to initialize the driving transistor T1.

A gate electrode G1 of the driving transistor T1 may be connected to one end (e.g., one electrode) Cst1 of the storage capacitor Cst, and a source electrode S1 of the driving transistor T1 may be connected to the driving voltage line 183 via the operation control transistor T5. A drain electrode D1 of the driving transistor T1 may be electrically connected to an anode of the organic light emitting diode OLED via the light emission control transistor T6. The driving transistor T1 may receive the data signal Dm according to a switching operation of the switching transistor T2, so as to supply a driving current Id to the organic light emitting diode OLED.

A gate electrode G2 of the switching transistor T2 may be connected to the scan line 151, and a source electrode S2 of the switching transistor T2 may be connected to the data line 171. A drain electrode D2 of the switching transistor T2 may be connected to the source electrode S1 of the driving transistor T1, and connected to the driving voltage line 183 via the operation control transistor T5. The switching transistor T2 may perform a switching operation so as to be turned on according to the scan signal Sn received through the scan line 151, to transmit the data signal Dm transmitted from the data line 171 to the source electrode S1 of the driving transistor T1.

A gate electrode G3 of the compensation transistor T3 may be connected (e.g., directly connected) to the scan line 151, and a source electrode S3 of the compensation transistor T3 may be connected to the drain electrode D1 of the driving transistor T1, and connected to an anode of the organic light emitting diode OLED via the light emission control transistor T6. A drain electrode D3 of the compensation transistor T3 may be connected to each of the one end Cst1 of the storage capacitor Cst, the drain electrode D4 of the initialization transistor T4, and the gate electrode G1 of the driving transistor T1. The compensation transistor T3 may be turned on according to the scan signal Sn received through the scan line 151, to connect the gate electrode G1 to the drain electrode D1 of the driving transistor T1, and thus, to diode-connect the driving transistor T1.

A gate electrode G4 of the initialization transistor T4 may be connected to the previous scan line 152, and a source electrode S4 of the initialization transistor T4 may be connected to the initialization voltage line 193. A drain electrode D4 of the initialization transistor T4 may be connected to each of the one end Cst1 of the storage capacitor Cst, the gate electrode G1 of the driving transistor T1, and the drain electrode D3 of the compensation transistor T3. The initialization transistor T4 may perform an initialization operation so as to be turned on according to the previous scan signal Sn-1 received through the previous scan line 152, to transmit the initialization voltage Vint to the gate electrode G1 of the driving transistor T1, and to initialize a gate voltage Vg of the gate electrode G1 of the driving transistor T1.

A gate electrode G5 of the operation control transistor T5 may be connected to the light emission control line 153, and a source electrode S5 of the operation control transistor T5 may be connected to the driving voltage line 183. A drain electrode D5 of the operation control transistor T5 may be connected to each of the source electrode S1 of the driving transistor T1 and the drain electrode S2 of the switching transistor T2.

A gate electrode G6 of the light emission control transistor T6 may be connected to the light emission control line 153, and the source electrode S6 of the light emission control transistor T6 may be connected to each of the drain electrode D1 of the driving transistor T1 and the source electrode S3 of the compensation transistor T3. A drain electrode D6 of the light emission control transistor T6 may be connected (e.g., electrically connected) to the anode of the organic light emitting diode OLED. The operation control transistor T5 and the light emission control transistor T6 may be concurrently (e.g., simultaneously or substantially simultaneously) turned on according to the light emission control signal EM transmitted from the light emission control line 153, such that the driving voltage ELVDD may be compensated through the diode-connected driving transistor T1 and transmitted to the organic light emitting diode OLED.

A gate electrode G7 of the bypass transistor T7 may be connected to the bypass control line 158, and a source electrode S7 of the bypass transistor T7 may be connected to each of the drain electrode D6 of the light emission control transistor T6 and the anode of the organic light emitting diode OLED. A drain electrode D7 of the bypass transistor T7 may be connected to each of the initialization voltage line 193 and the source electrode S4 of the initialization transistor T4.

Another end (e.g., another electrode) Cst2 of the storage capacitor Cst may be connected to the driving voltage line 183. A cathode of the organic light emitting diode OLED may be connected to a common voltage line 741 for transmitting a common voltage ELVSS.

In the embodiment described with reference to FIG. 1, the seven-transistor and one-capacitor structure including the bypass transistor T7 is illustrated. However, the present disclosure is not limited thereto, and the number of transistors and the number of capacitors may be variously changed.

Hereinafter, a detailed operation process of a pixel of the organic light emitting display device according to an example embodiment will be described in more detail with reference to FIG. 2.

Figure 2:
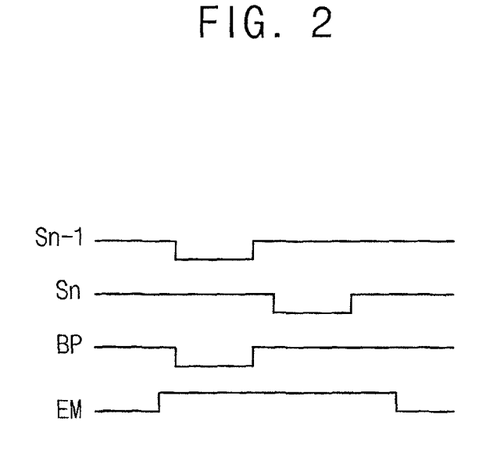
FIG. 2 is a timing diagram illustrating signals applied to a pixel of an organic light emitting display device, according to an example embodiment.

FIG. 2 is a timing diagram illustrating signals applied to a pixel of an organic light emitting display device according to an example embodiment.

Referring to FIG. 2, the previous scan signal (e.g., the previous low-level scan signal) Sn-1 may be supplied through the previous scan line 152 for an initialization period. The initialization transistor T4 may be turned on depending on the previous scan signal (e.g., the low-level previous scan signal) Sn-1. Then, the initialization voltage Vint may be applied from the initialization voltage line 193 to the gate electrode G1 of the driving transistor T1 through the initialization transistor T4, and the driving transistor T1 may be initialized by the initialization voltage Vint.

Then, the scan signal (e.g., the low-level scan signal) Sn may be supplied through the scan line 151 for a data programming period. The switching transistor T2 and the compensation transistor T3 may be turned on depending on the scan signal (e.g., the low-level scan signal) Sn. In this case, the driving transistor T1 may be diode-connected by the turned-on compensation transistor T3, and may be forward biased.

Then, a compensation voltage Dm+Vth (where Vth is a negative value), which is the data signal Dm supplied from the data line 171 minus a threshold voltage (Vth) of the driving transistor T1, may be applied to the gate electrode G1 of the driving transistor T1. That is, the gate voltage Vg applied to the gate electrode G1 of the driving transistor T1 may be the compensation voltage Dm+Vth.

The compensation voltage Dm+Vth and the driving voltage ELVDD may be applied to the ends Cst1 and Cst2 of the storage capacitor Cst, respectively. A charge corresponding to a voltage difference between the ends Cst1 and Cst2 may be stored in the storage capacitor Cst.

Then, the light emission control signal EM supplied from the light emission control line 153 may be changed from a high level to a low level for a light emission period. Then, the operation control transistor T5 and the light emission control transistor T6 may be turned on by the low-level light emission control signal EM for the light emission period.

Then, the driving current Id corresponding to a voltage difference between the gate voltage Vg of the gate electrode G1 of the driving transistor T1 and the driving voltage ELVDD may be generated, and the driving current Id may be supplied to the organic light emitting diode OLED through the light emission control transistor T6. A driving gate-source voltage Vgs of the driving transistor T1 may be maintained or substantially maintained at "(Dm+Vth)− ELVDD" by the storage capacitor Cst for the light emission period. According to a current-voltage relationship of the driving transistor T1, the driving current Id may be proportional to a square of a value obtained by subtracting the threshold voltage Vth from the driving gate-source voltage Vgs "(Dm−ELVDD)$^2$". Therefore, the driving current Id may be determined regardless of the threshold voltage Vth of the driving transistor T1.

In this case, the bypass transistor T7 may receive a bypass signal BP from the bypass control line 158. Accordingly, the driving current Id may be partially discharged through the bypass transistor T7 as a bypass current Ibp.

When the organic light emitting display device displays a black image, if the organic light emitting diode OLED emits light even though a small or minimum current of the driving transistor T1 flows as a driving current, the black image may not be properly displayed. Therefore, the bypass transistor T7 may disperse some of the minimum current of the driving transistor T1 to current paths, other than a current path to the organic light emitting diode OLED, as the bypass current Ibp. Here, the small or minimum current of the driving transistor T1 refers to a current for which the driving gate-source voltage Vgs of the driving transistor T1 may be less than the threshold voltage Vth, and thus, the driving transistor T1 may be turned off. The small or minimum driving current (e.g., a current which is equal to or less than about 10 pA) for which the driving transistor T1 is turned off may be transmitted to the organic light emitting diode OLED, and may be represented by an image of black luminance.

When the small or minimum driving current representing the black image flows, the effect of the bypass transfer of the bypass current Ibp may be significant. However, when a large driving current representing an image like a general image or a white image flows, an effect of the bypass current Ibp may be reduced or minimal. Therefore, when the driving current representing the black image flows, a light emitting current Ioled of the organic light emitting diode OLED, which is reduced by as much as a current amount of the bypass current Ibp exiting from the driving current Id through the bypass transistor T7, may have a small or minimum current amount that is at a level sufficient to represent the black image. Therefore, an accurate black luminance image may be achieved by using the bypass transistor T7 to improve a contrast ratio. In FIG. 2, the bypass signal BP is the same or substantially the same as the previous scan signal Sn-1, however, the present disclosure is not limited thereto.

Hereinafter, an arrangement structure of the plurality of pixels of the organic light emitting display device illustrated in FIGS. 1 and 2 will be described in more detail with reference to FIG. 3.

Figure 3:
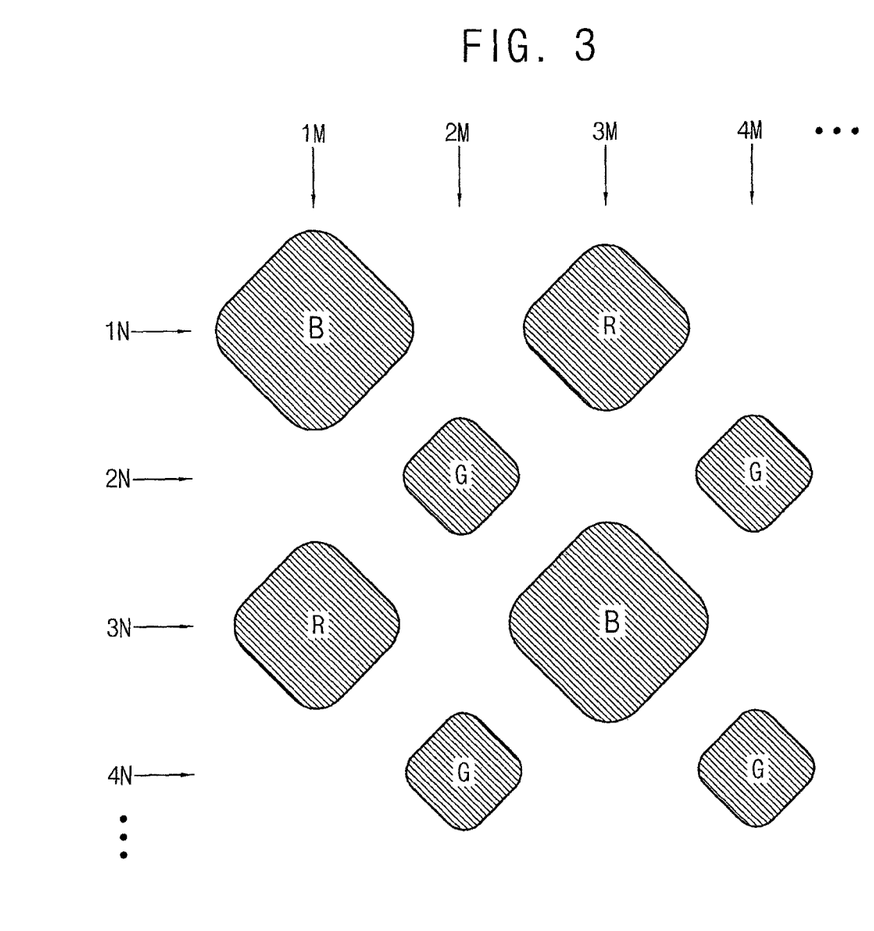
FIG. 3 is a plan view illustrating a plurality of pixels of an organic light emitting display device, according to an example embodiment.

FIG. 3 is a plan view illustrating a plurality of pixels of an organic light emitting display device according to an example embodiment.

Referring to FIG. 3, a blue pixel B corresponding to a first pixel, and a red pixel R corresponding to a third pixel, may be alternately disposed in a first row 1N. A plurality of green pixels G corresponding to a second pixel may be disposed to be separated by an interval (e.g., a predetermined interval) in a second row 2N that is adjacent to the first row 1N. A red pixel R and a blue pixel B may be alternately disposed in a third row 3N that is adjacent to the second row 2N. A plurality of green pixels G may be disposed to be separated by an interval (e.g., a predetermined interval) in a fourth row 4N adjacent to the third row 3N. The above-described pixel arrangement may be repeated to an N-th row. In this case, an area of the blue pixel B and an area of the red pixel R may be greater than an area of the green pixel G. Further, an area of the blue pixel B may be greater than or equal or substantially equal to an area of the red pixel R.

In this case, the blue pixel B and the red pixel R disposed in the first row 1N, and the green pixels G disposed in the second row 2N, may be alternately disposed. Accordingly, the blue pixel B and the red pixel R may be alternately disposed in a first column 1M, the green pixels G may be disposed to be spaced from each other by an interval (e.g., a predetermined interval) in an adjacent second column 2M, the red pixel R and the blue pixel B may be alternately formed in an adjacent third column 3M, and the green pixels G may be disposed to be spaced from each other by an interval (e.g., a predetermined interval) in an adjacent fourth column 4M. The above-described arrangement of the pixels may be repeated to an M-th column.

The aforementioned pixel disposition structure is referred to as a pentile matrix, and high definition with a small number of pixels may be implemented by adopting a driving method of sharing adjacent pixels to express colors.

Figure 4:
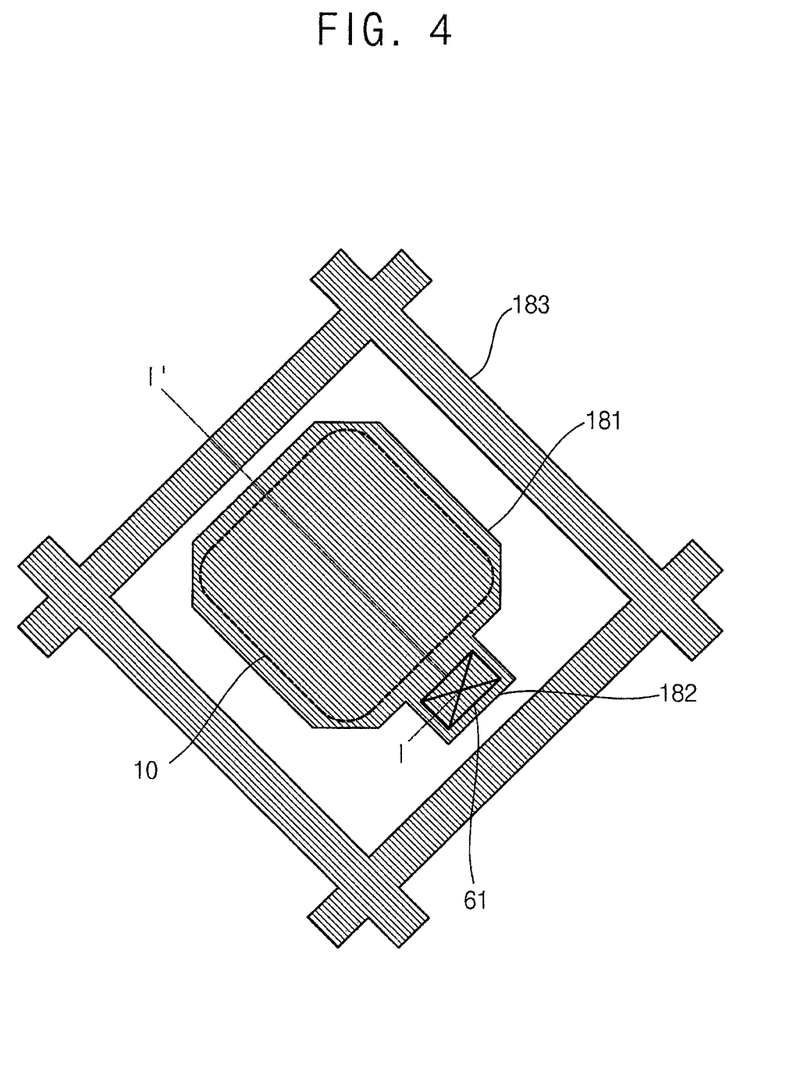
FIG. 4 is a plan view illustrating a pixel of an organic light emitting display device, according to an example embodiment.
Figure 5:
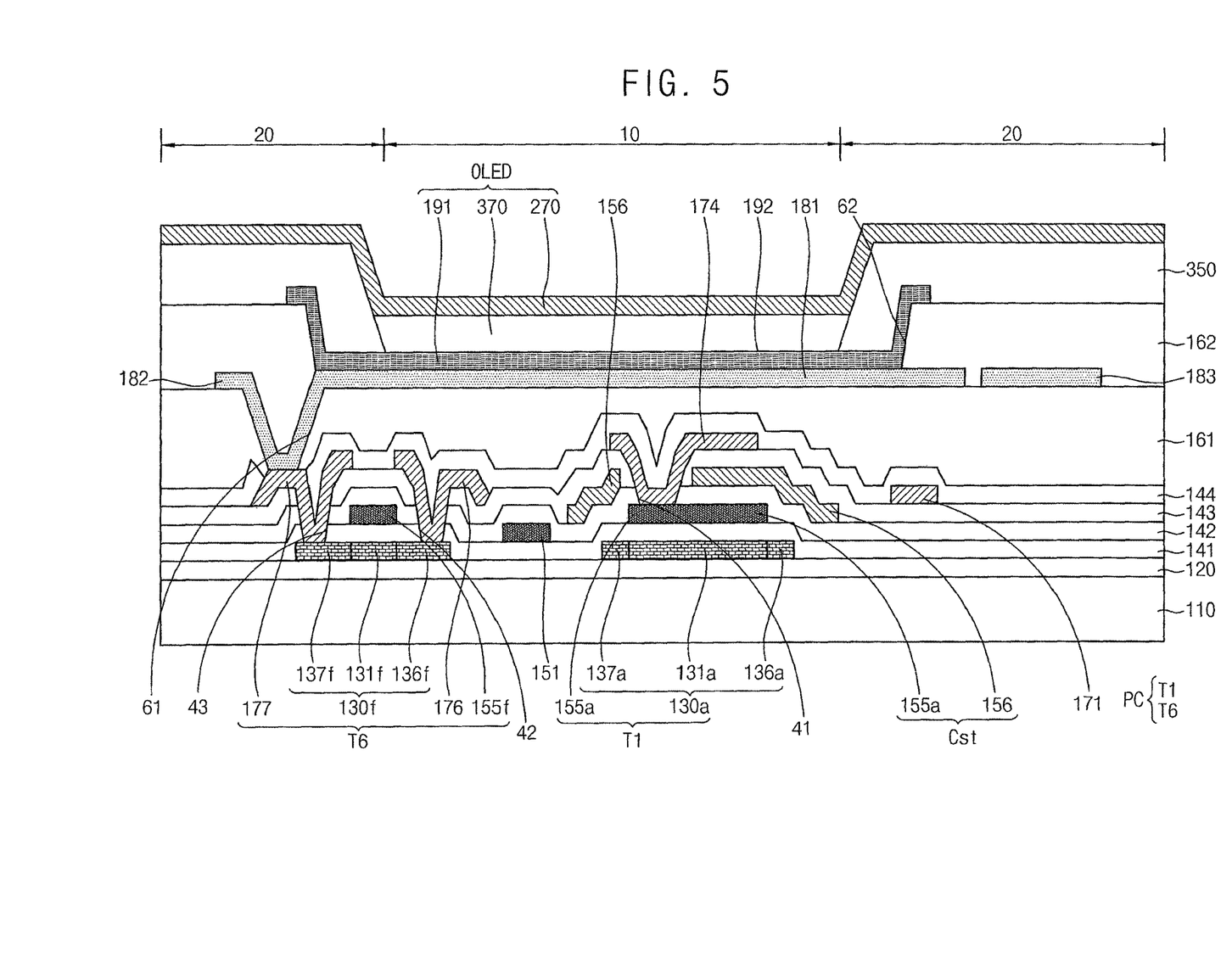
FIG. 5 is a cross-sectional view illustrating an example of the organic light emitting display device in FIG. 4 taken along the line I-I'.

FIG. 4 is a plan view illustrating a pixel of an organic light emitting display device according to an example embodiment. FIG. 5 is a cross-sectional view illustrating an example of the organic light emitting display device in FIG. 4 taken along the line I-I'.

Referring to FIGS. 4 and 5, an organic light emitting display device, according to an example embodiment, may include a substrate 110 including an emission region 10 and a non-emission region 20, a pixel circuit PC on the substrate 110, a planarizing conductive member (or planarizing conductor) 181 on the pixel circuit PC, and a pixel electrode 191 on the planarizing conductive member 181. A portion of the pixel circuit PC may overlap with the emission region 10, and the pixel electrode 191 may include a planarized surface 192 that is disposed in the emission region 10.

Here, stacked structures of the switching transistor T2, the compensation transistor T3, the initialization transistor T4, the operation control transistor T5, and the bypass transistor T7 may be the same or substantially the same as stacked structures of the driving transistor T1 and/or the light emission control transistor T6. Therefore, detailed description of the transistors T2, T3, T4, T5, and T7 may be omitted.

A buffer layer 120 may be formed on the substrate 110. The substrate 110 may be formed of insulating material, such as glass, crystal, ceramic, and/or plastic. The substrate 110 may include the emission region 10 from which light may be emitted, and the non-emission region 20 adjacent to the emission region 10. As described in more detail below, an organic light emitting layer 370 may be disposed in the emission region 10 so as to emit light. The buffer layer 120 may block impurities from the substrate 110 during a crystallization process for forming polysilicon so as to improve characteristics of the polysilicon, and may reduce stress applied to the substrate 110.

The pixel circuit PC may be disposed on the buffer layer 120. The pixel circuit PC may include a plurality of transistors, such as the driving transistor T1, the light emission control transistor T6, and/or the like. A portion of the pixel circuit PC may overlap with the emission region 10.

The semiconductor pattern 130, including a driving semiconductor portion 130a and a light emission control semiconductor portion 130f, may be formed on the buffer layer 120. The driving semiconductor portion 130a may include a driving channel 131a, and the light emission control semiconductor portion 130f may include a light emission control channel 131f. A driving source region 136a and a driving drain region 137a may be formed at opposite sides of the driving channel 131a, and a light emission control source region 136f and a light emission control drain region 137f may be formed at opposite sides of the light emission control channel 131f.

A first gate insulation layer 141 that covers the semiconductor pattern 130 may be formed thereon. First gate metal lines 151, 155a, and 155f including the scan line 151, the previous scan line, the light emission control line, which includes a light emission control gate electrode 155f, the bypass control line, and the driving gate electrode (a first storage electrode) 155a, may be formed on the first gate insulation layer 141.

A second gate insulation layer 142 that covers the first gate metal lines 151, 155a, and 155f and the first gate insulation layer 141 may be formed thereon. The first gate insulation layer 141 and the second gate insulation layer 142 may each be formed of silicon nitride (SiNx) and/or silicon oxide (SiOx).

Second gate metal lines 156 including a second storage electrode 156 may be formed on the second gate insulation layer 142. The second storage electrode 156 may be wider than the first storage electrode 155a functioning as the driving gate electrode, such that the second storage electrode 156 may entirely cover the driving gate electrode 155a.

Gate metal lines 151, 155a, 155f, and 156 including the first gate metal lines 151, 155a, and 155f and the second gate metal lines 156, may each be formed of multiple layers in which metal layers formed of any of copper (Cu), a copper alloy, aluminum (Al), an aluminum alloy, molybdenum (Mo), and/or a molybdenum alloy are stacked.

A first insulation interlayer 143 may be formed on the second gate insulation layer 142 and the second gate metal lines 156. The first insulation interlayer 143 may have contact holes 41, 42, and 43. First data metal lines 171, 174, 176, and 177, including the data line 171, a driving connecting member (or driving connector) 174, a light emission control source electrode 176, and a light emission control drain electrode 177, may be formed on the first insulation interlayer 143.

The data line 171 may cross the scan line 151, and may be connected to a switching source electrode. One terminal of the driving connecting member 174 may be connected to the first storage electrode 155a through a driving contact hole 41 formed in each of the second gate insulation layer 142 and the first insulation interlayer 143. The other terminal of the driving connecting member 174 may be connected to each of a compensation drain electrode and an initialization drain electrode.

The light emission control source electrode 176 may be connected to the light emission control source region 136f through a light emission control source contact hole 42 formed in each of the first gate insulation layer 141, the second gate insulation layer 142, and the first insulation interlayer 143. The light emission control drain electrode 177 may be connected to the light emission control drain region 137f through a light emission control drain contact hole 43 formed in each of the first gate insulation layer 141, the second gate insulation layer 142, and the first insulation interlayer 143.

A second insulation interlayer 144 may be formed on the first insulation interlayer 143 and the first data metal lines 171, 174, 176, and 177. The first insulation interlayer 143 and the second insulation interlayer 144 may each be formed of silicon nitride (SiNx) and/or silicon oxide (SiOx).

A via insulation layer 161 that covers the second insulation interlayer 144 may be formed thereon. The via insulation layer 161 may cover the second insulation interlayer 144 to be flattened (e.g., to have a planarized surface).

The via insulation layer 161 may have a contact hole 61. Second data metal lines 181, 182, and 183, including the planarizing conductive member 181, a pixel connecting member (or pixel connector) 182, and a driving voltage line 183 for transmitting a driving voltage, may be formed on the via insulation layer 161. The planarizing conductive member 181 may have a flattened (or planarized) top surface. The pixel connecting member 182 may connect the pixel circuit PC and the pixel electrode 191 to each other. The planarizing conductive member 181, the pixel connecting member 182, and the driving voltage line 183 may be disposed on the same or substantially the same level.

The planarizing conductive member 181 may be disposed on the pixel circuit PC. The planarizing conductive member 181 may be also disposed on the scan line 151 and/or the data line 171. A stepped region may be formed at the second insulation interlayer 144 according to a profile of the pixel circuit PC, the scan line 151, and the data line 171, which are located thereunder. The via insulation layer 161 that covers the second insulation layer 144 may be disposed thereon, so as to planarize the stepped region. However, the stepped region may not be fully planarized by the via insulation layer 161. In other words, a stepped surface may be formed at at least a portion of a top surface of the via insulation layer 161. The planarizing conductive member 181 may cover the via insulation layer 161 in the emission region 10, so as to planarize the via insulation layer 161. In other words, a top surface of the planarizing conductive member 181 may be entirely flat.

An area of the planarizing conductive member 181 may be greater than an area of the emission region 10. As illustrated in FIG. 4, the planarizing conductive member 181 may overlap with an entirety of the emission region 10, and may also overlap with a portion of the non-emission region 20 that is adjacent to the emission region 10. Therefore, the planarizing conductive member 181 may provide a planarized top surface throughout the emission region 10.

The pixel connecting member 182 may be connected to the light emission control drain electrode 177 through the contact hole 61 formed in the via insulation layer 161 and the second insulation interlayer 144. The contact hole 61 may be located in the non-emission region 20. Therefore, flatness of the planarizing conductive member 181 may be maintained.

The driving voltage line 183 may be disposed in the non-emission region 20. For example, as illustrated in FIG. 4, the driving voltage line 183 may be disposed in a grid form, so as to surround the emission region 10, and may extend along directions (e.g., diagonal directions) crossing each other. The driving voltage line 183 may be disposed as a grid form, so that a voltage drop of the driving voltage transmitted through the driving voltage line 183 may be reduced or minimized, or even be prevented or substantially prevented.

In an embodiment, the planarizing conductive member 181 may be connected to the pixel connecting member 182. In this case, the pixel connecting member 182 and the pixel electrode 191 may be connected to each other via the planarizing conductive member 181. Therefore, a driving current transmitted from the pixel circuit PC to the pixel connecting member 182 may be transferred to the pixel electrode 191 through the planarizing conductive member 181.

The data metal lines 171, 174, 176, 177, 181, 182, and 183, including the first data metal lines 171, 174, 176, and 177 and the second data metal lines 181, 182, and 183, may each be formed of multiple layers in which metal layers, including any of copper (Cu), a copper alloy, aluminum (Al), an aluminum alloy, molybdenum (Mo), and/or a molybdenum alloy, are stacked. For example, the data metal lines 171, 174, 176, 177, 181, 182, and 183 may each be formed of a triple layer of titanium/aluminum/titanium (Ti/Al/Ti), a triple layer of molybdenum/aluminum/molybdenum (Mo/Al/Mo), and/or a triple layer of molybdenum/copper/molybdenum (Mo/Cu/Mo).

A planarizing layer 162 that covers the planarizing conductive member 181, the pixel connecting member 182, the driving voltage line 183, and the via insulation layer 161 may be formed thereon. The planarizing layer 162 may cover the via insulation layer 161 to be flattened (e.g., to have a planarized surface). The via insulation layer 161 and the planarizing layer 162 may each be formed of a stacked layer of an organic material, such as polyacrylate resin, polyimide resin, and/or the like, or may each be formed of a stacked layer of an organic material and an inorganic material.

In an embodiment, the planarizing layer 162 may have an opening portion 62. The opening portion 62 may expose at least a portion of the planarizing conductive member 181.

The pixel electrode 191 may be formed on the planarizing conductive member 181 and the planarizing layer 162. The pixel electrode 191 may include the planarized surface 192 located in the emission region 10. For example, the planarized surface 192 of the pixel electrode 191 may be disposed in (or inside) the opening portion 62 of the planarizing layer 162. The pixel electrode 191 may be a reflective electrode.

In an embodiment, as illustrated in FIG. 5, the pixel electrode 191 may be disposed on (e.g., directly on) the planarizing conductive member 181. In other words, a bottom surface of the pixel electrode 191 may be in contact with a top surface of the planarizing conductive member 181. For example, the planarized surface 192 of the pixel electrode 191 may be disposed on the planarizing conductive member 181.

As described above, the planarizing conductive member 181 may cover the via insulation layer 161 so as to planarize the via insulation layer 161, and may provide a planarized top surface to upper structures (or layers). The pixel electrode 191 may include the planarized surface 192, and may be disposed on the planarized top surface of the planarizing conductive member 181, so that color shift of light, which is emitted from the organic light emitting layer 370 and reflected by the pixel electrode 191, may be reduced.

When a user views a display device, color shift may occur depending on a viewing angle of the user. The color shift may also be referred to as white angular dependency (WAD). The WAD refers to a phenomenon in which, when a white light is emitted from the display device, the white light may be observed from the front side of the display device, while a light of a different color, for example, a blue color, may be observed from a lateral side thereof, due to a wavelength shift caused by a light path difference. Hereinafter, the white angular dependency (WAD) and the color shift (hereinafter, also referred to as "WAD") are to be understood to have the same meaning.

In a comparative example, when a pixel electrode has a stepped region, light reflected by the pixel electrode may be emitted to various directions, so that color shift (WAD) may be intensified. However, in the organic light emitting display device according to an embodiment, the pixel electrode 191 may include the planarized surface 192 disposed on the planarizing conductive member 181, so that light reflected by the pixel electrode 191 may be emitted to a particular direction, and color shift (WAD) may be reduced.

A pixel defining layer (PDL) 350 that covers the planarizing layer 162 and a peripheral portion of the pixel electrode 191 may be formed thereon. The PDL 350 may expose a center portion of the pixel electrode 191. For example, the PDL 350 may expose the planarized surface 192 of the pixel electrode 191. The PDL 350 may be formed of an organic material, such as polyacrylate resin and/or polyimide resin, and/or may be formed of a silica-based inorganic material. The PDL 350 may be disposed (e.g., only disposed) at the non-emission region 20, so as to define the emission region 10.

The organic light emitting layer 370 may be formed on the exposed pixel electrode 191. A common electrode 270 may be formed on the organic light emitting layer 370. The common electrode 270 may also be formed on the PDL 350 over the plurality of pixels PX. The common electrode 270 may be a transmissive electrode. As such, the organic light emitting diode OLED, including the pixel electrode 191, the organic light emitting layer 370, and the common electrode 270, may be formed.

Here, the pixel electrode 191 may be an anode, which is a hole injection electrode, and the common electrode 270 may be a cathode, which is an electron injection electrode. However, the present disclosure is not limited thereto, and the pixel electrode 191 may be the cathode and the common electrode 270 may be the anode depending on a driving method thereof. When holes and electrons are injected into the organic light emitting layer 370 from the pixel electrode 191 and the common electrode 270, respectively, and excitons, which are combinations of the injected holes and electrons, fall from an excitation state to a ground state, light may be emitted.

The organic light emitting layer 370 may be formed of a low-molecular organic material or a high-molecular organic material, such as poly(3,4-ethylenedioxythiophene) (PEDOT). The organic light emitting layer 370 may be formed with multiple layers, including at least one of a light emission layer, a hole injection layer (HIL), a hole transport layer (HTL), an electron transport layer (ETL), and an electron injection layer (EIL). When the organic light emitting layer 370 includes each of the layers, the hole injection layer may be disposed on the pixel electrode 191, which may be a positive electrode, and the hole transport layer, the light emission layer, the electron transport layer, and the electron injection layer may be sequentially disposed (or laminated) thereon.

The organic light emitting layer 370 may include a red organic light emitting layer for emitting red light, a green organic light emitting layer for emitting green light, and a blue organic light emitting layer for emitting blue light. The red organic light emitting layer, the green organic light emitting layer, and the blue organic light emitting layer may be formed at a red pixel, a green pixel, and a blue pixel, respectively, to implement color images.

Further, in the organic light emitting layer 370, all of the red organic light emitting layer, the green organic light emitting layer, and the blue organic light emitting layer may be laminated together on the red pixel, the green pixel, and the blue pixel. In this case, a red color filter, a green color filter, and a blue color filter may be formed for each pixel to implement the color images. As another example, a white organic light emitting layer for emitting white light may be formed on all of the red pixel, the green pixel, and the blue pixel. The red color filter, the green color filter, and the blue color filter may be formed for each pixel to implement the color images. When the color images are implemented by using the white organic light emitting layer and the color filters, a deposition mask for depositing the red organic light emitting layer, the green organic light emitting layer, and the blue organic light emitting layer on individual pixels, e.g., the red pixel, the green pixel, and the blue pixel, respectively, may not be used.

The white organic light emitting layer described in another example may be formed by one organic light emitting layer, and may even include a configuration that may emit white light by laminating a plurality of organic light emitting layers. For example, the white organic light emitting layer may include a configuration that enables the white light to be emitted by combining at least one yellow organic light emitting layer and at least one blue organic light emitting layer, a configuration that enables the white light to be emitted by combining at least one cyan organic light emitting layer and at least one red organic light emitting layer, a configuration that enables the white light to be emitted by combining at least one magenta organic light emitting layer and at least one green organic light emitting layer, and/or the like.

An encapsulation member for protecting the organic light emitting diode OLED may be formed on the common electrode 270, and the encapsulation member may be sealed to the substrate 110 by a sealant. The encapsulation member may be formed of various suitable materials, such as glass, quartz, ceramic, plastic, and/or metal. A thin film encapsulation layer may be formed on the common electrode 270 by depositing at least one inorganic layer and at least one organic layer, without the usage of the sealant.

Figure 6:
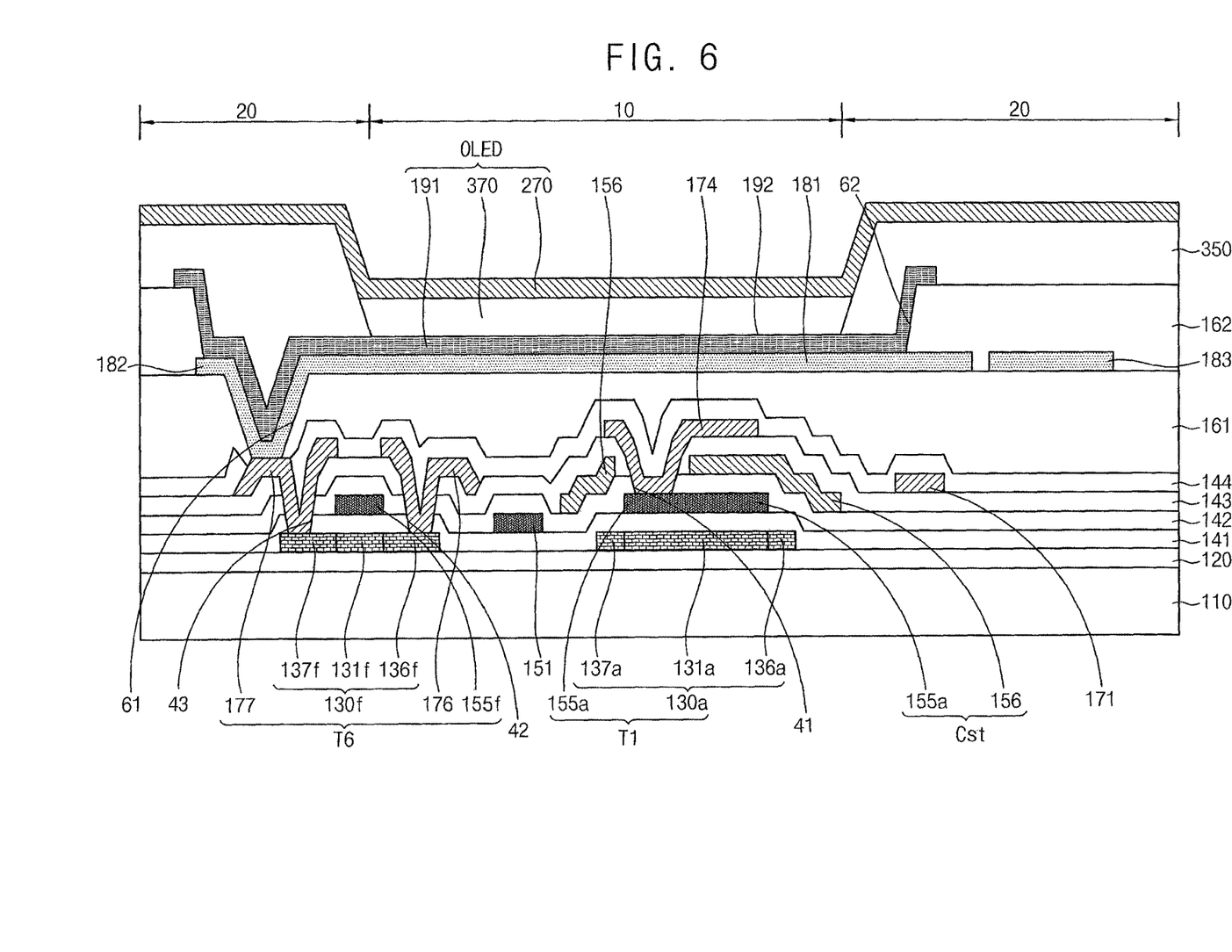
FIG. 6 is a cross-sectional view illustrating another example of the organic light emitting display device in FIG. 4 taken along the line I-I'.

FIG. 6 is a cross-sectional view illustrating another example of the organic light emitting display device in FIG. 4 taken along the line I-I'.

Referring to FIG. 6, in comparison with the example of the organic light emitting display device illustrated in FIG. 5, the opening portion 62 of the planarizing layer 162 may expose at least a portion of the pixel connecting member 182, as well as expose at least a portion of the planarizing conductive member 181. Accordingly, the pixel electrode 191 may be formed on the planarizing conductive member 181, the pixel connecting member 182, and the planarizing layer 162.

Figure 7:
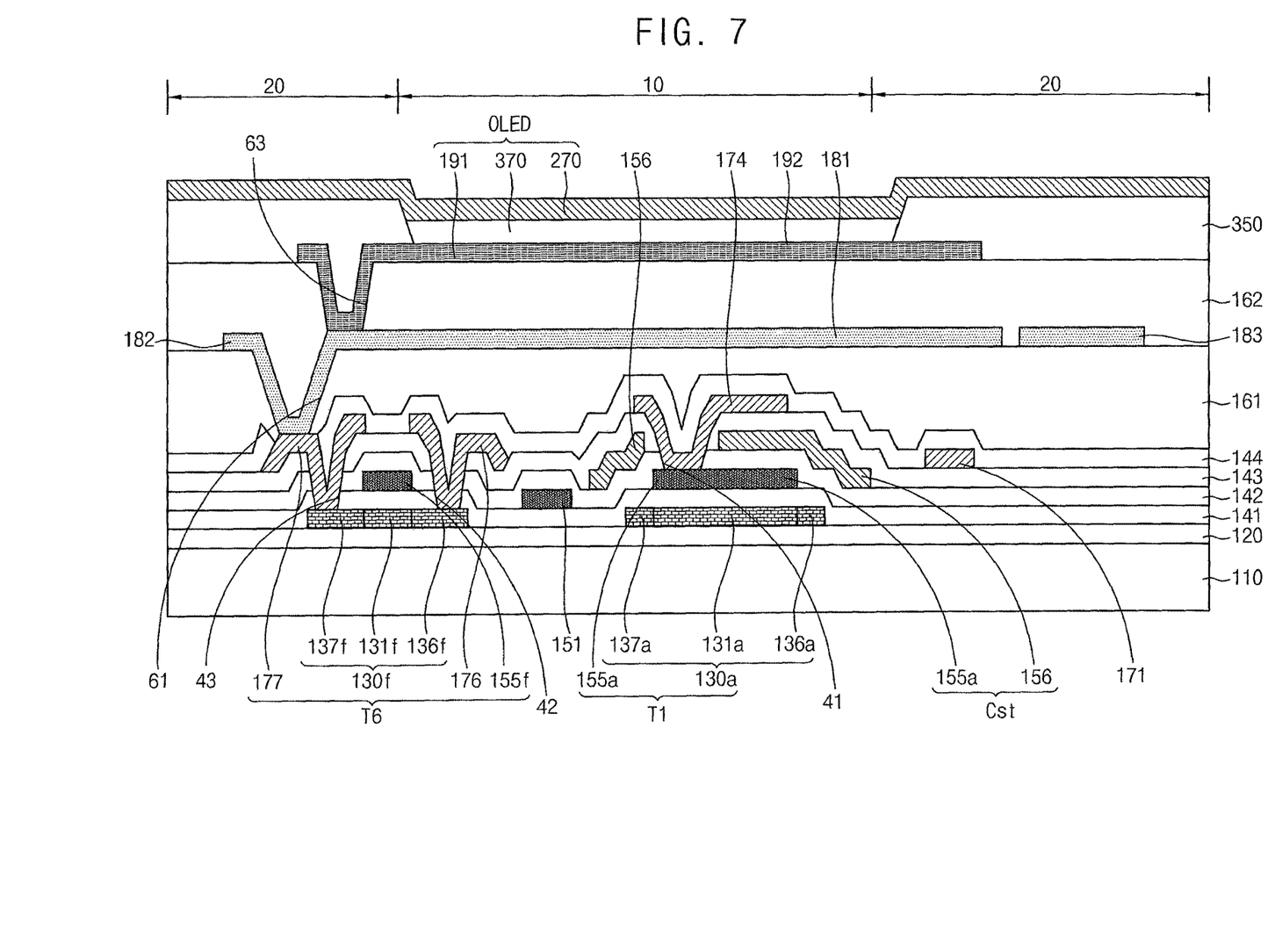
FIG. 7 is a cross-sectional view illustrating still another example of the organic light emitting display device in FIG. 4 taken along the line I-I'.

FIG. 7 is a cross-sectional view illustrating still another example of the organic light emitting display device in FIG. 4 taken along the line I-I'.

Referring to FIG. 7, in comparison with the example of the organic light emitting display device illustrated in FIG. 5, the planarizing layer 162 may include a contact hole 63 for exposing the pixel connecting member 182, instead of the opening portion 62 for exposing the planarizing conductive member 181. Accordingly, the planarizing layer 162 may entirely or substantially cover the planarizing conductive member 181. In this case, a top surface of the planarizing layer 162 disposed on the planarized top surface of the planarizing conductive member 181 may be flat or substantially flat.

The pixel electrode 191 may be disposed on the planarizing layer 162. The pixel electrode 191 may be disposed on the planarizing conductive member 181 with the planarizing layer 162 interposed therebetween. The pixel electrode 191 may be connected to the pixel connecting member 182 through the contact hole 63 formed in the planarizing layer 162. The contact hole 63 may be disposed in the non-emission region 20. Accordingly, flatness of the planarized surface 192 of the pixel electrode 191 may be maintained or substantially maintained.

Figure 8:
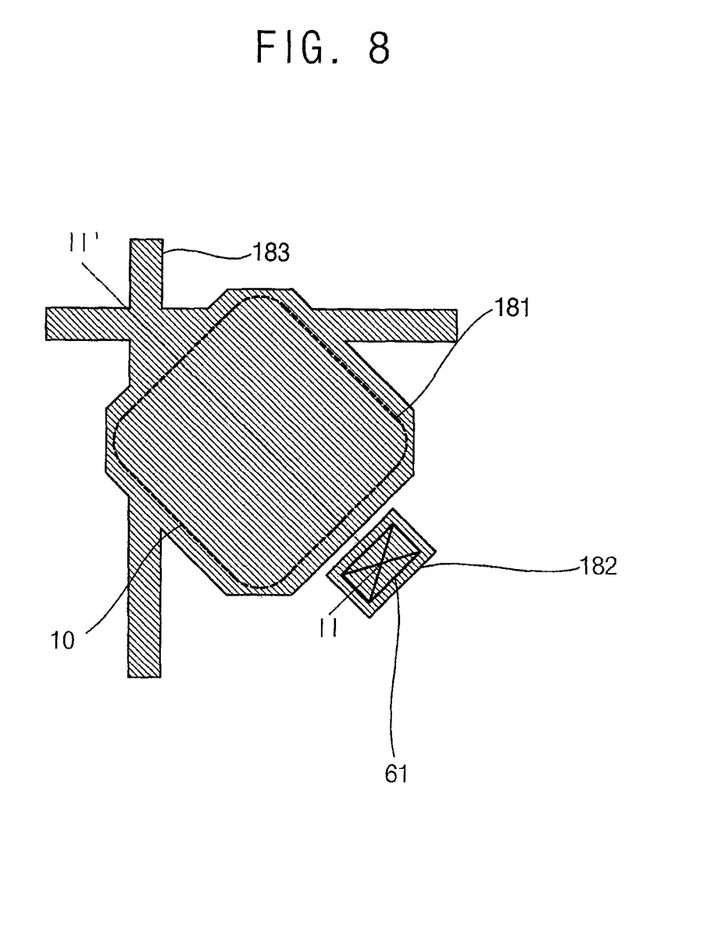
FIG. 8 is a plan view illustrating a pixel of an organic light emitting display device, according to another embodiment.
Figure 9:
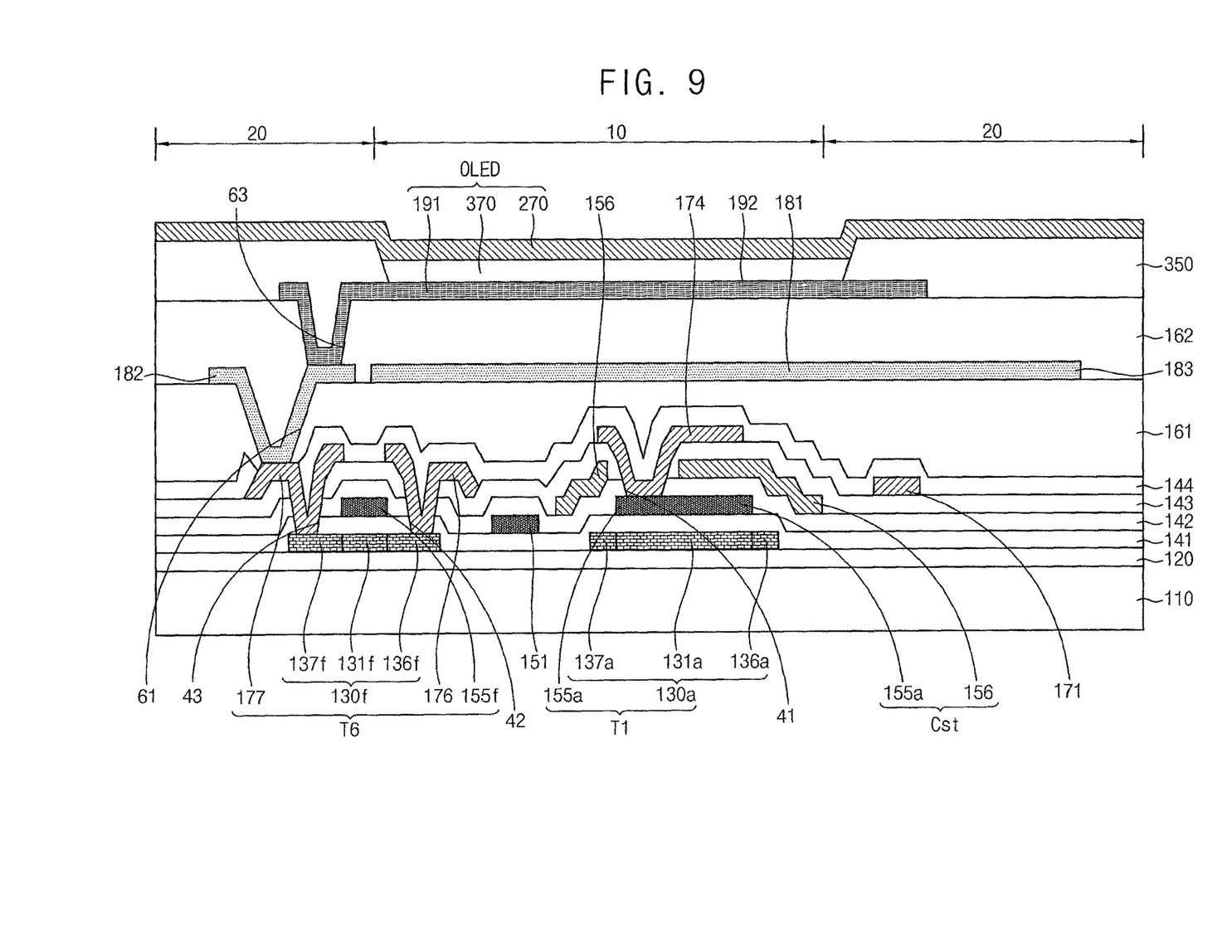
FIG. 9 is a cross-sectional view illustrating an example of the organic light emitting display device in FIG. 8 taken along the line II-II'.

FIG. 8 is a plan view illustrating a pixel of an organic light emitting display device according to another embodiment. FIG. 9 is a cross-sectional view illustrating an example of the organic light emitting display device in FIG. 8 taken along the line II-II'.

Referring to FIGS. 8 and 9, in comparison with the example of the organic light emitting display device illustrated in FIGS. 4 and 7, the planarizing conductive member 181 may be connected to the driving voltage line 183, instead of the pixel connecting member 182. The planarizing conductive member 181 may not be connected to (or may be separated from) the pixel connecting member 182. In this case, the pixel electrode 191 may be connected (e.g., directly connected) to the pixel connecting member 182 through the contact hole 63. Accordingly, a driving current transmitted from the pixel circuit PC to the pixel connecting member 182 may be transferred (e.g., directly transferred) to the pixel electrode 191.

The driving voltage line 183 may be disposed in the emission region 10 as well as the non-emission region 20. In this case, the driving voltage line 183 disposed in the emission region 10 may be a portion of the planarizing conductive member 181. For example, as illustrated in FIG. 8, the driving voltage line 183 may be disposed as a grid form, and may extend along directions parallel or substantially parallel to the scan line and the data line, which cross each other. However, the present disclosure is not limited thereto. The driving voltage line 183 may be disposed in the non-emission region 20, and may surround the emission region 10 as illustrated in FIG. 4, and a portion of the driving voltage line 183 may protrude to be connected to the planarizing conductive member 181.

The organic light emitting display device according to one or more embodiments of the present disclosure may be applied to a display device included in a computer, a notebook, a mobile phone, a smartphone, a smart pad, a PMP, a PDA, an MP3 player, and/or the like.

Although an organic light emitting display device according to one or more embodiments of the present disclosure have been described with reference to the drawings, the illustrated embodiments are examples, and may be variously modified and changed by a person having ordinary knowledge in the relevant technical field, all without departing from the spirit and scope of the present disclosure, as described in the following claims and their equivalents.

What is claimed is:

1. An organic light emitting display device, comprising:
a substrate comprising an emission region and a non-emission region;
a pixel circuit on the substrate, a portion of the pixel circuit overlapping with the emission region;
a planarizing conductive member on the pixel circuit; and
a pixel electrode on the planarizing conductive member, the pixel electrode having a planarized surface at the emission region, wherein the planarizing conductive member is configured to connect the pixel circuit to the pixel electrode.

2. The organic light emitting display device of claim 1, wherein the pixel electrode is directly on the planarizing conductive member.

3. The organic light emitting display device of claim 1, further comprising a pixel connecting member on a same level as that of the planarizing conductive member, the pixel connecting member connecting the pixel electrode to the pixel circuit.

4. The organic light emitting display device of claim 3, wherein the planarizing conductive member is connected to the pixel connecting member.

5. The organic light emitting display device of claim 3, further comprising a planarizing layer on the planarizing conductive member, wherein the pixel electrode is on the planarizing conductive member with the planarizing layer interposed there between.

6. The organic light emitting display device of claim 5, wherein the planarizing layer has a contact hole through which the pixel electrode is in contact with the pixel connecting member, and
wherein the contact hole is at the non-emission region.

7. The organic light emitting display device of claim 5, further comprising a driving voltage line on a same level as that of the planarizing conductive member, the driving voltage line being configured to transmit a driving voltage.

8. The organic light emitting display device of claim 7, wherein the driving voltage line is at the non-emission region.

9. The organic light emitting display device of claim 7, wherein the planarizing conductive member is connected to the driving voltage line.

10. The organic light emitting display device of claim 3, further comprising a via insulation layer covering the pixel circuit,
wherein the planarizing conductive member is on the via insulation layer.

11. The organic light emitting display device of claim 10, wherein the via insulation layer has a contact hole through which the pixel connecting member is in contact with the pixel circuit, and
wherein the contact hole is at the non-emission region.

12. The organic light emitting display device of claim 10, wherein a stepped surface is on at least a portion of a top surface of the via insulation layer, and
wherein a top surface of the planarizing conductive member is entirely flat.

13. The organic light emitting display device of claim 1, further comprising a scan line on the substrate, a portion of the scan line overlapping with the emission region,
wherein the planarizing conductive member is on the scan line.

14. The organic light emitting display device of claim 13, further comprising a data line on the substrate, a portion of the data line overlapping with the emission region, and the data line crossing the scan line, and
wherein the planarizing conductive member is on the data line.

15. The organic light emitting display device of claim 1, wherein an area of the planarizing conductive member is greater than an area of the emission region.

16. The organic light emitting display device of claim 1, further comprising:
an organic light emitting layer on the pixel electrode; and
a common electrode on the organic light emitting layer, the common electrode facing the pixel electrode.

17. The organic light emitting display device of claim 16, further comprising:
a via insulation layer between the pixel circuit and the planarizing conductive member, the via insulation layer covering the pixel circuit; and
a planarizing layer on the via insulation layer, the planarizing layer covering at least a portion of the planarizing conductive member.

18. The organic light emitting display device of claim 17, wherein the planarizing layer has an opening exposing a center portion of the planarizing conductive member, and
  wherein the planarized surface of the pixel electrode is in the opening.

19. The organic light emitting display device of claim 17, wherein the planarizing layer covers an entirety of the planarizing conductive member, and
  wherein the pixel electrode is on the planarizing conductive member with the planarizing layer interposed there between.

20. The organic light emitting display device of claim 17, further comprising a pixel defining layer on the planarizing layer, the pixel defining layer covering a peripheral portion of the pixel electrode and defining the emission region.

* * * * *